United States Patent [19]

Ide

[11] Patent Number: 4,537,855

[45] Date of Patent: Aug. 27, 1985

[54] PHOTOPOLYMERIZABLE PHOTOSENSITIVE COMPOSITION

[75] Inventor: Hiroshi Ide, Yokohama, Japan

[73] Assignee: Mitsubishi Chemical Industries Limited, Tokyo, Japan

[21] Appl. No.: 540,868

[22] Filed: Oct. 11, 1983

[30] Foreign Application Priority Data

Oct. 18, 1982 [JP]  Japan ................. 57-182471

[51] Int. Cl.$^3$ ............................................. G03C 1/68
[52] U.S. Cl. ....................... 430/285; 430/288; 430/287; 430/910; 204/159.14; 204/159.16; 204/159.12
[58] Field of Search ............... 430/287, 288, 927, 910, 430/908; 204/159.16, 159.14, 159.15

[56] References Cited

U.S. PATENT DOCUMENTS

| | | | |
|---|---|---|---|
| 3,804,628 | 4/1974 | Osada et al. | 430/287 |
| 3,871,885 | 3/1975 | Hertler | 430/281 |
| 3,900,594 | 8/1975 | Guthrie et al. | 204/159.19 X |
| 3,989,610 | 11/1976 | Tsukada et al. | 204/159.15 |
| 4,019,972 | 4/1977 | Faust | 204/159.15 X |
| 4,058,443 | 11/1977 | Murata et al. | 430/281 |
| 4,060,656 | 11/1977 | Naka et al. | 204/159.15 X |
| 4,259,432 | 3/1981 | Kondoh et al. | 430/288 X |
| 4,458,007 | 7/1984 | Geissler et al. | 430/284 |

OTHER PUBLICATIONS

H. Bennett (Ed.), *Concise Chemical and Technical Dictionary*, (3rd Ed.), Chemical Publishing Co. Inc., New York, 1974, pp. 895–896.
Julius Grant, (Ed.), *Hackh's Chemical Dictionary*, (4th Ed.), McGraw-Hill Book Company, New York, 1969, pp. 578–579.

*Primary Examiner*—John E. Kittle
*Assistant Examiner*—Cynthia Hamilton
*Attorney, Agent, or Firm*—Oblon, Fisher, Spivak, McClelland & Maier

[57] ABSTRACT

A photopolymerizable photosensitive composition characterized by comprising a photopolymerizable photosensitive resin having polyfunctional ethylenically unsaturated groups in the side chains or end groups thereof, and a photopolymerization initiator.

25 Claims, No Drawings

PHOTOPOLYMERIZABLE PHOTOSENSITIVE COMPOSITION

BACKGROUND OF THE INVENTION

1. Field of the Invention

This invention relates to photopolymerizable photosensitive compositions which comprise, as main components, photopolymerizable photosensitive resins having ethylenically unsaturated groups of the specific type in the side chains or end groups thereof, and photopolymerization initiators. More particularly, it relates to photosensitive compositions which comprise novel resins of high sensitivity.

2. Description of the Prior Art

Photopolymerizable photosensitive compositions have now been used in the printing industry as photosensitive resin plates for relief printing and offset PS (presensitized) plates. In particular, the offset PS plates are much simpler in handling than known wipe-on plates, contributing to save the steps of the printing plate-making process. Accordingly, the PS plates have recently become popular more and more and are extending their market rapidly. Most of currently sold PS plates make use of so-called diazo-type photosensitive materials typical of which is a condensation product of paradiazodiphenylamine and formaldehyde. The PS plates using this type of diazo compound have relatively good sensitivity but are disadvantageous in that they are poor in printing durability, chemical resistance, and storage stability. In contrast, compositions comprising photo-crosslinkable photosensitive resins are able to form network molecular bonds therein upon irradiation of light, giving a printing plate of good printing durability. However, the compositions have the drawback that, in most cases, organic solvents are used as a developer to remove the photosensitive resin composition in non-crosslinked areas, thus being unfavorable from the standpoint of working environment and that the running cost becomes high. In contrast, with compositions comprising photopolymerizable photosensitive resins, the development is feasible with use of aqueous solutions and particularly aqueous alkali solutions. The aqueous solutions are more inexpensive than organic solvents coupled with another advantage in that they are less dangerous particularly from the physiological standpoint. In addition, the photopolymerizable photosensitive resin compositions form a molecular structure of three-dimensional network in portions where exposed, so that the resulting printing plate is very advantageous from the standpoint of printing durability.

Other important fields of applications of photo-crosslinkable and photopolymerizable photosensitive resin compositions include plating materials for metal corrosion at the time of fabrication of printed circuits, mask or resist materials for soldering processes, resist materials for chemical milling of metals, and resist materials used for fabrication of multi-layer metallic lithographs and gravure plates. For instance, in the fabrication of printed circuits, a substrate for the circuit, e.g. a copper substrate, is covered with a photosensitive resin composition on the surface thereof and exposed to light in an imagewise pattern, after which non-exposed areas are completely removed by the use of a suitable liquid developer while leaving a substantial area of the substrate to be exposed to air. The portions from which the photosensitive resin composition has been removed are etched by any known technique or plated with a metal. In these fields of applications, an aqueous alkali solution which is less dangerous can be used as a liquid developer, and photopolymerizable photosensitive compositions from which a durable resist film can be obtained are very advantageous.

In the above-mentioned various fields, a new image exposure system is being introduced in order to improve the working efficiency. For example, in case where an image is formed on an offset PS plate or a substrate for printed circuit, it is the common practice to bring an original film into intimate contact with the PS plate or substrate under which light is irradiated on the photosensitive layer of the plate or substrate through the film. In particular, with some offset PS plates, a system of exposure of the plate by an enlarged projection through a microfilm has been put into practice. This system has the advantage over known systems in that silver halide films can be saved. Also, another system is put into practice in which visible light from a laser beam, e.g. an argon ion laser beam, is directly scanned or exposed on a photosensitive layer of the substrate, thereby forming an image. This system does not need fabrication of silver halide films at all, so that much labor can be saved. Moreover, a further advancement of computerization will permit direct retrieval of signals of an image original from a computer. Thus, this type of laser exposure system is believed to be promising. However, in order to effectively form an image using the above-discussed new exposure systems, photosensitive resin compositions which are covered on individual substrates are required to have higher photosensitivity. It is generally accepted that photopolymerizable photosensitive resin compositions are superior to diazo photosensitive materials and photocrosslinkable photosensitive resin compositions. However, the above requirement is not adequately satisfied.

Accordingly, an object of the present invention is to provide compositions comprising photopolymerizable resins which can be developed by the use of aqueous alkali solutions and have higher speed of photosensitivity.

Known photopolymerizable photosensitive resins are, for example: products obtained by addition reaction of glycidyl (meth-)acrylates with polymers having carboxyl groups in the side chains thereof such as, for example, (co-)polymers (meaning the same as resins) of (meth-)acrylic acid, maleic acid and the like; products obtained by addition reaction of (meth-)acrylic acid with polymers having epoxy groups in the side chains such as, for example, glycidyl (meth-)acrylate (co-)polymers or epoxy-novolak resins; products obtained by reaction of (meth-)acrylic chloride with polymers having hydroxyl groups in the side chains thereof such as, for example, hydroxyethyl (meth-)acrylate (co-)polymers, vinyl alcohol and the like thereby introducing (meth-)acryloyl groups thereinto; and products obtained by reaction between polyurethanes obtained by polycondensation of polyols and diisocyanates, and (meth-)acrylates having hydroxyl groups. Thus, polymers having monofunctional ethylenically unsaturated groups in the side chains thereof are conventionally used.

The increase in amount of the ethylenically unsaturated compound in the composition containing photopolymerizable photosensitive resin usually results in an increase of the sensitivity.

However, ethylenically unsaturated compounds are ordinarily viscous liquids at a normal temperature. If the compound is added in an amount sufficient to obtain a desired level of sensitivity, the photosensitive layer becomes fairly adhesive on the surface thereof, making the handling very difficult.

SUMMARY OF THE INVENTION

The present inventor has made intensive studies in order to solve the problems or difficulties of the prior art. As a result, it has been found that when resins having a specific type of ethylenically unsaturated group in the side chains or end groups thereof are used, there can be obtained photopolymerizable photosensitive resin compositions which have excellent photosensitivity without lowerings of developability and image quality. The present invention is based on the above finding.

The prominent feature of the present invention resides in a photopolymerizable photosensitive composition which is characterized by comprising a photopolymerizable photosensitive resin having polyfunctional ethylenically unsaturated groups in the side chains or end groups thereof and a photopolymerization initiator.

DETAILED DESCRIPTION OF THE PREFERRED EMBODIMENTS

The present invention is described in detail.

The photopolymerizable photosensitive resins useful in the present invention should have polyfunctional ethylenically unsaturated groups in the side chains or end groups thereof. The ethylenically unsaturated groups should be two or more in number per one side chain or end group.

When the photopolymerizable photosensitive compositions are irradiated with actinic light, the resins having polyfunctional ethylenically unsaturated groups are exerted with the direct action of photodecomposed products of a photopolymerization initiator which is another essential component as will be described hereinafter, and are also synergistically exerted with the action of photodecomposed products of an ethylenically unsaturated compound attacked by the photodecomposed products of the photopolymerization initiator. As a result, the resin undergoes the three-dimensional addition polymerization together with the ethylenically unsaturated compound and is thus efficiently cured and substantially insolubilized, thereby forming an image area.

In prior art, when a photo-cured image is formed using monofunctional resins, it has been essential to incorporate ethylenically unsaturated compounds in photopolymerizable photosensitive compositions.

In contrast, when the resin of the invention having polyfunctional ethylenically unsaturated groups is used, it was unexpectedly found that good photocured images are formed without using ethylenically unsaturated compounds in combination.

The polyfunctional ethylenically unsaturated groups have, for example, a structural unit of the following general formula

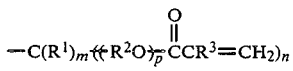

(in which $R^1$ represents a hydrogen atom, an alkyl group such as methyl, ethyl or the like, and a hydroxyalkyl group such as hydroxymethyl, hydroxyethyl or the like, $R^2$ represents an alkylene group such as methylene, ethylene, trimethylene or the like, $R^3$ represents hydrogen atom or methyl, m is 0 or 1 and n is 2 or 3 provided that $m+n=3$, and p is an integer of 1 to 3).

The polyfunctional ethylenically groups having a structural unit of the above formula wherein $R^2$ is methylene group and p is 1 are preferred.

The photopolymerizable photosensitive resins of the present invention are, for example, resins having structural units of the following general formula

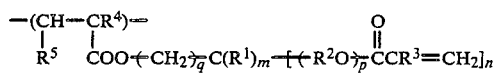

(in which $R^1$, $R^2$, $R^3$, m, n and p have the same meanings as defined above, respectively, $R^4$ represents hydrogen atom or methyl group, $R^5$ represents hydrogen atom or carboxyl group, and q is an integer of 0 to 3).

Such resins can readily be obtained by the esterification between polymers having carboxylic or carboxylic anhydride groups in the side chains or end groups and polyfunctional ethylenically unsaturated compounds having hydroxyl groups by any known method.

The polymers having carboxylic acid or carboxylic anhydride groups in the side chains or end groups include, for example, (meth-)acrylic acid homopolymers, (meth-)acrylic acid/(meth-)acrylate copolymers, styrene/(meth-)acrylic acid copolymers, styrene/maleic anhydride copolymers, and partially esterified products thereof.

These (co)polymers deteriorate in developability when the molecular weight is excessively large. On the contrary, when the molecular weight is too small, the sensitivity and the strength of a photocured image portion lower.

Accordingly, an average molecular weight of the (co)polymers is preferred to be in the range of 1,000–50,000 and most preferably in the range of 2,000–10,000.

Specific examples of the polyfunctional ethylenically unsaturated compounds include pentaerythritol triacrylate, pentaerythritol trimethacrylate, pentaerythritol diacrylate, pentaerythritol dimethacrylate, trimethylolethane diacrylate, trimethylolethane dimethacrylate, trimethylolpropane diacrylate, trimethylolpropane dimethacrylate, dimethylolmethanol diacrylate (glycerol-1,3-diacrylate), dimethylolmethanol dimethacrylate (glycerol-1,3-dimethacrylate), trimethylolmethane diacrylate, trimethylolmethane dimethacrylate, and the like.

The reaction between the polymers and the polyfunctional ethylenically unsaturated compounds is an ordinarily known esterification reaction between carboxylic acids and alcohols. For instance, ethers or aromatic hydrocarbons are used as solvents for the reaction and the reaction mixture is heated in the presence of a catalyst such as sulfuric acid, paratoluenesulfonic acid or the like. With carboxylic anhydrides, products esterified with unsaturated compounds having hydroxyl groups can be readily obtained by merely heating them in solvents of aromatic hydrocarbons. Also, there is mentioned a method in which carboxylic acids are converted into carboxylic chlorides by the use of thionyl chloride or the like, and then reacted with unsaturated compounds having hydroxyl groups in the presence of an alkali catalyst such as pyridine, triethanolamine or the like. In order to suppress occurrence of the addition polymerization of polyfunctional ethylenically unsaturated compounds, it is preferable to add reducible compound to the reaction system as a polymerization inhibitor. As such a compound, hydroquinone is effective.

When the ratio of the introduction of the polyfunctional ethylenically unsaturated groups into the polymer in the side chains thereof is increased, the sensitivity increases but the developability with aqueous alkali solutions lowers. Although the amount of the polyfunctional ethylenically unsaturated compound may vary depending on the type of polymer or liquid developer, it is convenient to add the polyfunctional ethylenically unsaturated compound to the polymer in the side chains thereof in an amount of 0.03–0.98 equivalent, preferably 0.10–0.80 equivalent, to the carboxyl groups of the polymer.

The photopolymerizable photosensitive resins of the present invention may be used in combination with other polymers. Polymers being admixed are used in an amount of 5–500 parts by weight per 100 parts by weight of the photopolymerizable photosensitive resin.

Examples of the polymers being admixed include (meth-)acrylic acid homo-polymers or copolymers of (meth-)acrylic ester with other (meth-)acrylic esters, vinyl compounds including, for example, vinyl ether, vinyl acetate or saponified products thereof, styrene, vinylpyrrolidone, butadiene and so on; copolymers of polyacrylic anhydride, maleic acid, maleic semi-ester, semi-amide and/or derivatives of anhydride or itaconic acid with suitable comonomers such as styrene, ethylene, vinyl ether, vinyl acetate and the like; cellulose derivative or the like.

It is preferable to add ethylenically unsaturated compounds to the photopolymerizable photosensitive composition in order to improve the sensitivity.

Such compound is a monomer having ethylenically unsaturated double bonds which is attacked, when the photopolymerizable photosensitive resin composition is irradiated with actinic light, by the photodecomposed product of the photopolymerization initiator, and is addition-polymerized three-dimensionally together with the polyfunctional resin and cured, rendering the composition substantially insoluble. The term "monomer" used herein is intended to mean a concept relative to polymer material and include oligomers such as dimers, trimers and the like, aside from monomers in a strict sense.

The monomers having ethylenically unsaturated double bonds include, for example, unsaturated carboxylic acids, esters of unsaturated carboxylic acids and aliphatic polyhydroxy compounds, esters of unsaturated carboxylic acids and aromatic polyhydroxy compounds, and esters obtained by esterification reaction of unsaturated carboxylic acids, polycarboxylic acids and polyhydroxy compounds such as the above-indicated aliphatic polyhydroxy compounds, aromatic polyhydroxy compounds and the like.

Specific examples of the unsaturated carboxylic acids include acrylic acid, methacrylic acid, itaconic acid, crotonic acid, maleic acid and the like.

The aliphatic polyhydroxy compounds include, for example, dihydric alcohols such as ethylene glycol, diethylene glycol, triethylene glycol, tetraethylene glycol, neopentyl glycol, propylene glycol, 1,2-butanediol and the like, trihydric alcohols such as trimethylolethane, trimethylolpropane, glycerol and the like, tetrahydric or polyhydric alcohols such as pentaerythritol, tripentaerythritol and the like, and polyhydroxycarboxylic acids such as dihydroxylmaleic acid and the like.

The aromatic polyhydroxy compounds include hydroquinone, resorcin, catechol, pyrogallol and the like.

Examples of the polycarboxylic acids include phthalic acid, isophthalic acid, terephthalic acid, tetrachlorophthalic acid, trimellitic acid, pyromellitic acid, benzophenonedicarboxylic acid, maleic acid, fumaric acid, malonic acid, glutaric acid, adipic acid, sebacic acid, tetrahydrophthalic acid, and the like.

Examples of the esters of the aliphatic polyhydroxy compounds and the unsaturated carboxylic acids are acrylates such as ethylene glycol diacrylate, triethylene glycol diacrylate, tetramethylene glycol diacrylate, trimethylolpropane triacrylate, trimethylolethane triacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, tripentaerythritol octaacrylate, glycerol diacrylate and the like; methacrylates such as triethylene glycol dimethacrylate, tetramethylene glycol dimethacrylate, trimethylolpropane trimethacrylate, trimethylolethane trimethacrylate, pentaerythritol dimethacrylate, pentaerythritol trimethacrylate, pentaerythritol tetraacrylate, dipentaerythritol dimethacrylate, dipentaerythritol trimethacrylate, dipentaerythritol tetramethacrylate, tripentaerythritol octamethacrylate, ethylene glycol dimethacrylate, 1,2-butanediol dimethacrylate, sorbitol tetramethacrylate and the like; itaconates such as ethylene glycol diitaconate, propylene glycol diitaconate, 1,2-butanediol diitaconate, tetramethylene glycol diitaconate, pentaerythritol triitaconate and the like; crotonates such as ethylene glycol dicrotonate, diethylene glycol dicrotonate, pentaerythritol tetracrotonate and the like; and malates such as ethylene glycol dimaleate, triethylene glycol dimaleate, pentaerythritol dimaleate and the like.

The esters of the aromatic polyhydroxy compounds and the unsaturated carboxylic acids include hydroquinone diacrylate, hydroquinone dimethacrylate, resorcin diacrylate, resorcin dimethacrylate, pyrogallol triacrylate and the like.

The esters obtained by the esterification reaction of unsaturated carboxylic acids, polycarboxylic acids and polyhydroxy compounds are not necessarily a single product. Typical of the esters are indicated in Table 1. In the table, Z represents an acryloyl or methacryloyl group.

TABLE 1

$Z-OC_2H_4-OOC-C_6H_4-COO-C_2H_4O-Z$ $Z(OC_2H_4)_{\overline{x}}OOC(CH_2)_{\overline{x}}COO(C_2H_4O)_{\overline{x}}Z$ $Z(OC_2H_4)_{\overline{x}}OOC-CH=CH-COO(C_2H_4O)_{\overline{x}}Z$ $Z(OC_2H_4)_{\overline{x}}OOC-C_6H_4-COO(C_2H_4O)_2Z$
(with the two ester groups on the benzene ring)

$Z-OCH_2\phantom{xx}C_2H_5\phantom{xxxxxx}C_2H_5\phantom{xx}CH_2O-Z$
$\phantom{xxxxx}\diagdown\phantom{x}\diagup\phantom{xxxxxxxxxx}\diagdown\phantom{x}\diagup$
$\phantom{xxxxxxxx}C\phantom{xxxxxxxxxxxxxxxx}C$
$\phantom{xxxxx}\diagup\phantom{x}\diagdown\phantom{xxxxxxxxxx}\diagup\phantom{x}\diagdown$
$Z-OCH_2\phantom{xx}CH_2OOC-C_6H_4-COOCH_2\phantom{xx}CH_2O-Z$ TABLE 1-continued

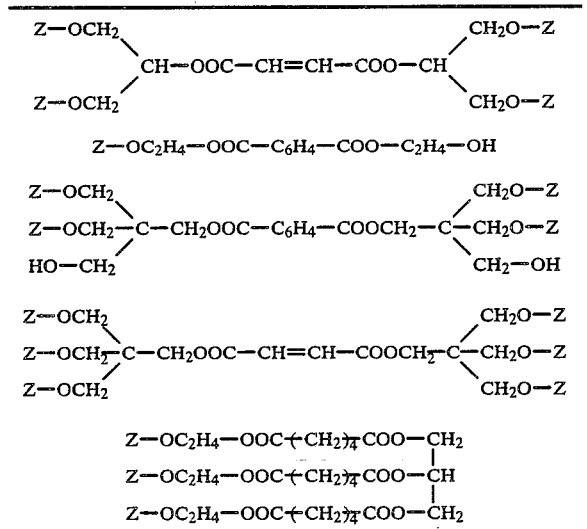

Examples of other compounds having ethylenically unsaturated double bonds used in the present invention include acrylamides such as acrylamide, ethylene bisacrylamide, hexamethylene bisacrylamide and the like; methacrylamides such as ethylene bismethacrylamide, hexamethylene bismethacrylamide and the like; allyl esters such as diallyl phthalate, diallyl malonate, diallyl fumarate, triallyl isocyanurate and the like; and vinyl-containing compounds such as divinyl adipate, divinyl phthalate, ethylene glycol divinyl ether and the like.

Especially, trimethylolpropane triacrylate, trimethylolethane triacrylate, and pentaerythritol tetraacrylate exhibit relatively high sensitivity and are favorable because they do not lower the ink receptivity on the photocured image areas.

The photopolymerization initiators which are another essential component of the composition according to the invention are conventionally known initiators. For instance, benzoin, benzoin alkyl ethers, benzophenone, anthraquinone, benzil, Michler's ketone, and a mixture of biimidazole and Michler's ketone are favorably used. In order for effective photosensitization by exposure to visible light of an argon ion laser beam, compounding systems such as biimidazole and dialkylaminostyryl derivatives, S-triazine and cyanine derivatives, and S-triazine and thiapyrylium derivatives are preferred.

The composition of the present invention comprises the components in the following ratios ranging 10-80 wt %, preferably 20-60 wt % of a polymer containing a polyfunctional resin, 90-20 wt %, preferably 80-40 wt % of an ethylenically unsaturated compound, and 0.1-20 wt %, preferably 1-10 wt % of a photopolymerization initiator.

The photopolymerizable composition of the invention may be further admixed with other ingredients, depending on the purpose, in order to modify physical properties. For instance, thermal polymerization inhibitors, antioxidants, colorants, plasticizers, application aids and the like may be compounded in an amount not more than 20 wt % based on the total weight of the three components.

The photopolymerizable composition of the invention may be used to form a photosensitive material in the absence of solvent, or may be dissolved in a solvent to obtain a solution, followed by applying it on a support, and drying to form a photosensitive material. The solvents are, for example, methyl ethyl ketone, acetone, cyclohexanone, ethyl acetate, butyl acetate, amyl acetate, ethyl propionate, toluene, xylene, benzene, monochlorobenzene, chloroform, carbon tetrachloride, trichloroethylene, trichloroethane, dimethylformamide, methyl cellosolve, ethyl cellosolve, butyl cellosolve, tetrahydrofuran, pentoxone(4-methyl-4-methoxy-2-pentanone), methanol, ethanol, propanol and the like.

The supports applied for preparing a photosensitive material from the photopolymerizable composition of the invention include, for example, sheets of metals such as aluminium, magnesium, copper, zinc, chromium, nickel, iron and the like or alloys comprising the metals as a main component, papers such as high quality paper, art paper, release paper and the like, inorganic sheets such as glasses, ceramics and the like, and sheets of polymers such as polyethylene tetrephthalate, polyethylene, polymethyl methacrylate, polyvinyl chloride, vinyl chloride-vinylidene chloride copolymers, polystyrene, 6-nylon, 6,6-nylon, cellulose diacetate, cellulose triacetate, cellulose acetate butylate, and the like. These supports may be applied to a photosensitive layer on both sides of the layer. Moreover, the supports may be treated on the surface thereof in order to control the adhesion strength.

In order to prevent the photopolymerizable composition of the present invention from suffering disadvantageous effects of oxygen such as lowered sensitivity, deterioration of storage stability and the like, any known techniques may be used, for example, a releasable transparent cover sheet may be provided on the photosensitive layer, or a covering layer of, for example, a wax material or a watersoluble or an alkali-soluble polymer may be formed on the layer.

The light sources for exposure suitably applicable to the composition of the present invention include generalpurpose light source capable of emitting ultraviolet and visible light rays having wavelengths over 180 nm such as, for example, high pressure mercury lamps, xenone lamps, metal halide lamps, fluorescent lamps, tungsten lamps, argon ion laser, helium cadmium laser, krypton laser and the like.

The photopolymerizable composition of the present invention has uses in various fields of, for example, making of printing plates for lithograph, intaglio, and relief printing or the like, photoresists for the preparation of printed circuits or IC circuits, dry films, non-silver halide lith films, and image formation of relief images and reproduction of images. Having generally described the invention, a more complete understanding can be obtained by reference to certain specific examples, which are included for purposes of illustration only and are not intended to be limiting unless otherwise specified.

Reference 1

9.0 g of methyl methacrylate, 0.86 g of methacrylic acid (charging ratio by mole=9/1), and 50 mg of benzoyl peroxide were dissolved in 50 g of dioxane, followed by heating the solution at 80° C. for 4 hours with agitation while purging with nitrogen and subsequently charging into a large amount of water. The resulting polymer was dissolved in a small amount of acetone and dropped into a large amount of a methanol/water mixture for re-precipitation, followed by drying in vacuo to obtain methyl methacrylate/methacrylic acid copolymer (molecular weight≈5,000).

Reference 2

8.08 g (0.01 mole) of a partially esterified product of styrene-maleic anhydride copolymer (styrite CM-2L, molecular weight≈5,000, product by Sankyo Kasei Co., Ltd.), 2.32 g (0.02 mole) of 2-hydroxyethyl acrylate, and 20 mg of hydroquinone were dissolved in 50 g of dioxane, followed by heating at 100° C. for 4 hours under agitation and dropping in a large amount of water for precipitation. Thereafter, the precipitate was dried in vacuo to obtain a carboxylic acid semi-ester polymer (monofunctional resin).

Reference 3

The procedure of Reference 2 was repeated except that pentaerythritol triacrylate was used instead of 2-hydroxyethyl acrylate, thereby obtaining a carboxylic semi-ester polymer (polyfunctional resin).

Reference 4

The procedure of Reference 2 was repeated except that trimethylolethane diacrylate was used instead of 2-hydroxyethyl acrylate, thereby obtaining a carboxylic acid semi-ester polymer (polyfunctional resin).

EXAMPLE 1

0.45 g of a partially esterified product of styrene/maleic anhydride copolymer (Styrite CM-2L, product of Sankyo Kasei Co., Ltd.), 0.1 g of the methyl methacrylate/methacrylic acid copolymer prepared in Reference 3, 0.45 g of the polyfunctional resin of reference 3, 0.5 g of trimethylolpropane triacrylate (product of Osaka Organic Chem. Ind. Co., Ltd.), each 0.04 g of photopolymerization initiators represented by the following structural formulas [I] and [II], and 0.012 g of "Victoria Pure Blue BOH" (product of Hodogaya Chemical Co., Ltd.) were dissolved in 18 g of ethyl cellosolve. The resulting photosensitive solution was applied onto a grained and anodized aluminium plate by the use of a whirler in a dry thickness of 20 mg/dm². At this stage no stickiness was observed on the photosensitive layer. Thereafter, an aqueous polyvinyl alcohol solution was applied onto the photosensitive layer to form a protective layer with a dry thickness of 20 mg/dm², thereby obtaining a sample. A step tablet (by Eastman Kodak Co.) was deposited on the sample under vacuum, followed by exposing it to light from a 3 KW high pressure mercury lamp (Unipulse UMH-3000, by Ushio Electric Inc.) at a distance of 1 m for 15 seconds and developing with a liquid developer consisting of an aqueous 1% sodium silicate solution. As a result, the sensitivity (steps of photocured image) was found to be 12 steps. Furthermore, the developability (developing speed, removability by dissolution, and the like), resolution and ink receptivity were found to be good. Thus, the fundamental requirements as the offset PS plate were satisfied.

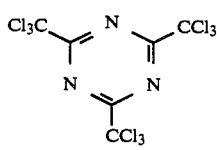

[I]

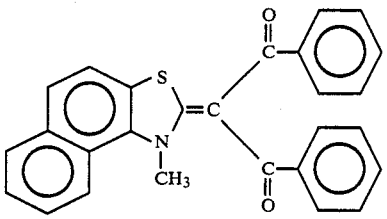

[II]

COMPARATIVE EXAMPLE 1

The general procedure of Example 1 was repeated except that the same amount of the monofunctional resin obtained in Reference 2 was used instead of the polyfunctional polymer, thereby obtaining a sample. The sample was evaluated in the same manner as in Example 1, revealing the sensitivity of 8 steps, which was as low as ¼ time the sensitivity of Example 1.

EXAMPLE 2

The general procedure of Example 1 was repeated except that the trimethylolpropane triacrylate was increased in amount from 0.5 g to 1.0 g, thereby obtaining a sample. The sample was evaluated in the same manner as in Example 1, revealing that the sensitivity of 14 steps.

EXAMPLE 3

The general procedure of Example 1 was repeated except that the trimethylolpropane triacrylate was removed from the photosensitive solution, thereby obtaining a sample. The sample was evaluated in the same manner as in Example 1, revealing that the sensitivity of 5 steps.

COMPARATIVE EXAMPLE 2

The general procedure of Example 1 was repeated except that the trimethylolpropane triacrylate was removed from the photosensitive solution of Comparative Example 1, thereby obtaining a sample. The sample was evaluated in the same manner as in Example 1, with the result that no photocured image was formed and even when the exposure time was extended to 150 seconds which was ten times longer, no photocured image was observed.

EXAMPLE 4

The general procedure of Example 1 was repeated except that the polyfunctional resin prepared in Reference 4 was used instead of the polyfunctional resin obtained in Reference 3, thereby obtaining a sample. The sample was evaluated in the same manner as in Example 1, revealing the sensitivity of 10 steps, which was an high as 2 times the sensitivity of the sample using the monofunctional resin described in Comparative Example 1.

EXAMPLE 5

0.4 g of a partially esterified product of styrene/maleic anhydride copolymer (Styrite CM-2L, product by Sankyo Kasei Co., Ltd.), 0.1 g of the methyl methacrylate/methacrylic acid copolymer obtained in Reference 1, 0.5 g of the polyfunctional resin obtained in Reference 3, 0.1 g of dioctyl phthalate, 1.0 g of trimethylolpropane triacrylate (product of Osaka Organic Chem. Ind. Co., Ltd.), 0.1 g of 2,2'-bis(orthobromophenyl)-4,4',5,5'-tetraphenylbiimidazole, 0.05 g of 2-(paradiethylaminostyryl)-benzo[4,5]benzothiazole, 0.06 g of 2-mercaptobenzothiazole, and 0.012 g of "Victoria Pure Blue BOH" (product of Hodogaya Chemical Co., Ltd.) were dissolved in 18 g of ethyl cellosolve to obtain a photosensitive solution. The solution was applied onto a grained and anodized aluminium plate by the use of a whirler in a dry thickness of 20 mg/dm². Thereafter, an aqueous polyvinyl alcohol solution was applied onto the layer to form a protective layer with a dry thickness of 20 mg/dm², thereby obtaining a sample. The sample was exposed to a visible light beam with a wavelength of 488 nm from an argon ion laser irradiator (Gas Laser GLG-3300, by Nippon Electric Co., Ltd.) under conditions of an irradiation beam diameter on the plate of 15 microns and a light quantity of 10 mW for different scanning speeds up to 55 m/sec. Thereafter, the irradiated sample was developed with a liquid developer consisting of an aqueous 1% sodium silicate solution. As a result, it was found that an irradiation energy necessary for obtained a photocured image capable of faithfully reproducing the irradiation beam diameter was found to be 1–3 mJ/cm².

EXAMPLE 6

4.6 g of glycerine was dissolved in 50 g of ethyl acetate, to which several drops of triethylamine was added while agitating. Thereafter, a 1,4-dioxane solution of 10 g of acrylic chloride was dropped into the solution, followed by agitating at room temperature for further 2 hours and further agitating for 1 hour after raising the temperature up to 50° C. The reaction solution was discharged and admixed with water, followed by shaking, removing water-soluble components from the system and distilling off the 1,4-dioxane to obtain glycerol-1,3-diacrylate. 10 g (0.05 mole) of the glycerol-1,3-diacrylate, 20.2 g (0.03 mole) of a partially esterified product of styrene/maleic anhydride copolymer ("Styrite CM-2L", molecular weight≈5000, product of Sankyo Kasei Co., Ltd.), 20 mg of hydroquinone were dissolved in 85 g of 1,4-dioxane and agitated at 90° C for 4 hours, followed by dropping the reaction solution into 3 liters of water and drying the resulting precipitate in vacuo, thereby obtaining a carboxylic acid semi-ester polymer (polyfunctional resin).

0.45 g of the polyfunctional resin obtained by adding the glycerol-1,3-diacrylate in the side chains thereof, 0.45 g of a partially esterified product of styrene/maleic anhydride copolymer (CM-2L), and 0.1 g of the methyl methacrylate/methacrylic acid copolymer obtained in Reference 1 were dissolved in ethyl cellosolve together with the ethylenically unsaturated compound, photopolymerization initiator and dye used in Example 1 in the same manner as in Example 1, thereby obtaining a sample. The sample was evaluated in the same manner as in Example 1, with the result that the sensitivity was found to be 10 steps.

Having now fully described this invention, it will be apparent to one of ordinary skill in the art that many changes and modifications can be made thereto without departing from the spirit or scope of the invention as set forth herein.

What is claimed as new and intended to be covered as Letters Patent is:

1. A photopolymerizable photosensitive composition comprising:

(a) a photopolymerizable photosensitive high molecular weight compound having polyfunctional ethylenically unsaturated groups in the side chains or end groups thereof, wherein said polyfunctional ethylenically unsaturated groups have structural units of the general formula

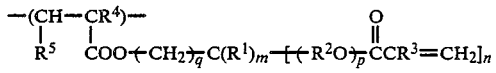

wherein $R^1$ represents a hydrogen atom, alkyl group or hydroxyalkyl group, $R^2$ represents an alkylene group, $R^3$ and $R^4$ independently represent a hydrogen atom or methyl group, $R^5$ represents a hydrogen atom or carboxyl group, m is 0 or 1 and n is 2 or 3 provided that $m+n=3$, p is an integer of 1 to 3, and q is an integer of 0 to 3 and (b) a photopolymerization initiator.

2. A photopolymerizable photosensitive composition of claim 1 wherein $R^2$ is methylene group and p is 1.

3. A photopolymerizable photosensitive composition according to claim 1, further comprising an ethylenically unsaturated compound.

4. The photopolymerizable photosensitive composition of claim 1 wherein $R^1$ is —$CH_3$ or —$C_2H_5$.

5. The photopolymerizable photosensitive composition of claim 1 wherein $R^1$ is hydroxymethyl or hydroxyethyl.

6. The photopolymerizable photosensitive composition of claim 1 wherein $R^2$ is ethylene or trimethylene.

7. The photopolymerizable photosensitive composition of claim 1 which further includes 5–500 parts by weight of an additional polymer per 100 parts by weight of said photopolymerizable photosensitive resin.

8. The photopolymerizable photosensitive composition of claim 7 wherein said additional polymer is an acrylic acid or methacrylic acid homopolymer.

9. The photopolymerizable photosensitive composition of claim 7 wherein said additional polymer is a copolymer of acrylic or methacrylic acid and at least one compound selected from the group consisting of vinyl ether, vinyl acetate, styrene, vinylpyrrolidone, butadiene and saponified vinyl acetate.

10. The photopolymerizable photosensitive composition of claim 7 wherein said additional polymer is a copolymer of
(i) at least one compound selected from the group consisting of polyacrylic anhydride, maleic acid, maleic acid semiester, maleic acid semiamide, maleic anhydride or itaconic acid and
(ii) at least one compound selected from the group consisting of styrene, ethylene, vinyl ether and vinyl acetate.

11. The photopolymerizable photosensitive composition of claim 7 wherein said additional polymer is a derivative of cellulose.

12. The photopolymerizable photosensitive composition of claim 3 wherein said ethylenically unsaturated compound is selected from the group consisting of ethylenically unsaturated carboxylic acids, esters of aliphatic polyhydroxy compounds and unsaturated carboxylic acids, esters of aromatic polyhydroxy compounds and unsaturated carboxylic acids, and polyesters from unsaturated polycarboxylic acids and polyhydroxy compounds.

13. The photopolymerizable photosensitive composition of claim 12 wherein said ethylenically unsaturated carboxylic acid is selected from the group consisting of acrylic acid, methacrylic acid, itaconic acid, crotonic acid and maleic acid.

14. The photopolymerizable photosensitive composition of claim 12 wherein said esters of aliphatic polyhydroxy compounds and unsaturated carboxylic acids are selected from the group consisting of ethylene glycol diacrylate, triethylene glycol diacrylate, tetramethylene glycol diacrylate, trimethylolpropane triacrylate, trimethylolethane triacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, tripentaerythritol octaacrylate, glycerol diacrylate, triethylene glycol dimethacrylate, tetramethylene glycol dimethacrylate, trimethylolpropane trimethacrylate, trimethylolethane trimethacrylate, pentaerythritol dimethacrylate, pentaerythritol trimethacrylate, pentaerythritol tetraacrylate, dipentaerythritol dimethacrylate, dipentaerythritol trimethacrylate, dipentaerythritol tetramethacrylate, tripentaerythritol octamethacrylate, ethylene glycol dimethacrylate, 1,2-butanediol dimethacrylate, sorbitol tetramethacrylate, ethylene gylcol diitaconate, propylene glycol diitaconate, 1,2-butanediol diitaconate, tetramethylene glycol diitaconate, pentaerythritol triitaconate, ethylene glycol dicrotonate, diethylene glycol dicrotonate, pentaerythritol tetracrotonate, ethylene glycol dimaleate, triethylene glycol dimaleate, and pentaerythritol dimaleate.

15. The photopolymerizable photosensitive composition of claim 14 wherein said esters of aliphatic polyhydroxy compounds and unsaturated carboxylic acids are selected from the group consisting of trimethylolpropane triacrylate, trimethylolethane triacrylate and pentaerythritol tetraacrylate.

16. The photopolymerizable photosensitive composition of claim 12 wherein said esters of aromatic polyhydroxy compounds and unsaturated carboxylic acids are selected from the group consisting of hydroquinone diacrylate, hydroquinone dimethacrylate, resorcin diacrylate, resorcin dimethacrylate, and pyrogallol triacrylate.

17. The photopolymerizable photosensitive composition of claim 12 wherein said polyesters from unsaturated polycarboxylic acids and polyhydroxy compounds are selected from the group consisting of

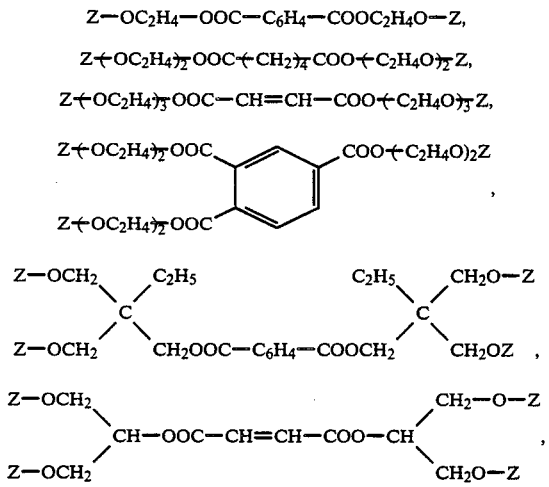

-continued

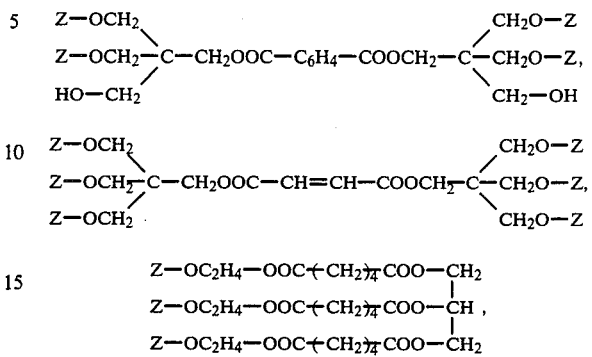

wherein Z is an acryloyl or methacryloyl group.

18. The photopolymerizable photosensitive composition of claim 3, wherein said ethylenically unsaturated compound is selected from the group consisting of acrylamide, ethylene bisacrylamide, hexamethylene bisacrylamide, ethylene bismethacrylamide, hexamethylene bismethacrylamide, diallyl phthalate, diallyl malonate, diallyl fumarate, triallyl isocyanurate, divinyl adipate, divinyl phthalate, and ethylene glycol divinyl ether.

19. The photopolymerizable photosensitive composition of claim 1 wherein said photopolymerization initiator is selected from the group consisting of benzoin, benzoin alkyl ethers, benzophenone, anthraquinone, benzil, Michler's ketone, a biimidazole Michler's ketone mixture, a biimidazoledialkylaminostyryl derivative mixture, a S-triazinecyanine derivative mixture, and S-triazine-thiapyrylium derivative mixture.

20. The photopolymerizable photosensitive composition of claim 2 wherein said composition comprises 10–80 weight percent of said photopolymerizable photosensitive high molecular weight compound, 90–20 weight percent of said ethylenically unsaturated compound and 0.1–20 weight percent of said photopolymerization initiator.

21. The photopolymerizable photosensitive composition of claim 20 wherein said composition comprises 20–60 weight percent of said photopolymerizable photosensitive high molecular weight compound, 80–40 weight percent of said ethylenically unsaturated compound and 1–10 weight percent of said photopolymerization initiator.

22. The photopolymerizable photosensitive composition of claim 1 wherein said composition further comprises 0.1 to 20 weight percent of a thermal polymerization inhibitor, antioxidant, colorant, plasticizer, application aid or a combination thereof.

23. The photopolymerizable photosensitive composition of claim 22 further comprising an organic solvent selected from the group consisting of methyl ethyl ketone, acetone, cyclohexanone, ethyl acetate, butyl acetate, amyl acetate, ethyl propionate, toluene, xylene, benzene, monochlorobenzene, chloroform, carbon tetrachloride, trichloroethylene, trichloroethane, dimethylformamide, methyl cellosolve, ethyl cellosolve, butyl cellosolve, tetrahydrofuran, 4-methyl-4-methoxy-2-pentanone, methanol, ethanol, and propanol.

24. The photopolymerizable photosensitive composition of claim 3 wherein said composition further comprises 0.1 to 20 weight percent of a thermal polymerization inhibitor, antioxidant, colorant, plasticizer, application aid or a combination thereof.

25. The photopolymerizable photosensitive composition of claim 24 further comprising an organic solvent selected from the group consisting of methyl ethyl ketone, acetone, cyclohexanone, ethyl acetate, butyl acetate, amyl acetate, ethyl propionate, toluene, xylene, benzene, monochlorobenzene, chloroform, carbon tetrachloride, trichloroethylene, trichloroethane, dimethylformamide, methyl cellosolve, ethyl cellosolve, butyl cellosolve, tetrahydrofuran, 4-methyl-4-methoxy-2-pentanone, methanol, ethanol, and propanol.

* * * * *